United States Patent
Teo et al.

(10) Patent No.: US 7,592,270 B2
(45) Date of Patent: Sep. 22, 2009

(54) MODULATION OF STRESS IN STRESS FILM THROUGH ION IMPLANTATION AND ITS APPLICATION IN STRESS MEMORIZATION TECHNIQUE

(75) Inventors: Lee Wee Teo, Singapore (SG); Elgin Quek, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 11/940,326

(22) Filed: Nov. 15, 2007

(65) Prior Publication Data

US 2008/0064191 A1 Mar. 13, 2008

Related U.S. Application Data

(63) Continuation of application No. 11/304,412, filed on Dec. 15, 2005, now abandoned.

(51) Int. Cl.
*H01L 21/336* (2006.01)
*H01L 21/8234* (2006.01)
*H01L 21/469* (2006.01)
*H01L 21/31* (2006.01)

(52) U.S. Cl. ........................ 438/778; 438/197; 438/199; 438/510; 438/530; 438/783; 257/E21.473; 257/E21.633; 257/E21.635

(58) Field of Classification Search .................. 438/197, 438/199, 510, 530; 257/E21.473, E21.633, 257/E21.635
See application file for complete search history.

(56) References Cited

U.S. PATENT DOCUMENTS

| | | | | |
|---|---|---|---|---|
| 6,159,856 A | * | 12/2000 | Nagano | 438/683 |
| 6,939,814 B2 | * | 9/2005 | Chan et al. | 438/778 |
| 7,214,629 B1 | * | 5/2007 | Luo et al. | 438/778 |
| 2002/0079547 A1 | * | 6/2002 | Kobayashi | 257/411 |
| 2004/0253791 A1 | * | 12/2004 | Sun et al. | 438/308 |
| 2005/0199958 A1 | * | 9/2005 | Chen et al. | 257/368 |
| 2005/0285202 A1 | * | 12/2005 | Huang et al. | 257/368 |
| 2007/0024321 A1 | * | 2/2007 | Lin et al. | 326/81 |

* cited by examiner

*Primary Examiner*—Walter L Lindsay, Jr.
*Assistant Examiner*—Mohsen Ahmadi
(74) *Attorney, Agent, or Firm*—Horizon IP Pte Ltd (57) ABSTRACT

Some example embodiments of the invention provide a method to improve the performance of MOS devices by increasing the stress in the channel region. An example embodiment for a NMOS transistor is to form a tensile stress layer over a NMOS transistor. A heavy ion implantation is performed into the stress layer and then an anneal is performed. This increases the amount of stress from the stress layer that the gate retains/memorizes thereby increasing device performance.

32 Claims, 5 Drawing Sheets

MODULATION OF STRESS IN STRESS FILM THROUGH ION IMPLANTATION AND ITS APPLICATION IN STRESS MEMORIZATION TECHNIQUE

CROSS REFERENCES TO RELATED APPLICATIONS

This application is a Continuation application which claims benefit of co-pending U.S. patent application Ser. No. 11/304,412 filed Dec. 15, 2005. This application is hereby incorporated by reference in its entireties.

FIELD OF THE INVENTION

This invention relates generally to fabrication of semiconductor devices and more particularly to a method to change the stress in a stress layer over a FET device.

DESCRIPTION OF THE PRIOR ART

Performance and economic factors of integrated circuit design and manufacture have caused the scale of elements (e.g. transistors, capacitors and the like) of integrated circuits to be drastically reduced in size and increased in proximity on a chip. That is, increased integration density and proximity of elements reduces the signal propagation path length and reduces signal propagation time and susceptibility to noise and increase of possible clock rates while the reduction in element size necessary for increased integration density increases to ratio of functionality which can be provided on a chip to the costs of production (e.g. wafer/chip area and process materials) per chip and, potentially, the cost of devices containing the chips by reducing the number of inter-chip and inter-board connections required.

It has also been shown theoretically and confirmed experimentally that mechanical stress in the channel region of an FET can increase or decrease carrier mobility significantly; depending on the sign of the stress (e.g. tensile or compressive) and the carrier type (e.g. electron or hole). Tensile stress increases electron mobility and decreases hole mobility while compressive stress increases hole mobility while decreasing electron mobility in the doped semiconductor crystal lattice forming the transistor channel. This phenomenon is well-recognized and theories concerning the physical effects by which it occurs are, in any event, unimportant to its exploitation. In this regard, numerous structures and materials have been proposed for inducing tensile or compressive force in a semiconductor material, such as shallow trench isolation (STI) structures, gate spacers, etch-stop layers and silicide which are generally included in integrated circuit designs.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

C. H. Chen, T. L. Lee, T. H. Hou, C. L. Chen, C. C. Chen, J. W. Hsu, K. L. Cheng, Y. H. Chiu, H. J, Tao, Y. Jin, C. H. Diaz, S. C. Chen, and M.-S. Liang, "Stress Memorization Technique (SMT) by Selectively Strained-Nitride Capping for Sub-65 nm High-Performance Strained-Si Device Application", 2004 Symposium on VLSI Technology Digest of Technical Papers.

U.S. Pat. No. 6,939,814 and US20050093078A1: Inventor: Chan, Victor; —Increasing carrier mobility in NFET and PFET transistors on a common wafer—Adjusting a carrier mobility for different semiconductor conductivities on the same chip by forming layer of material applying stress level on surface of chip, and selectively reducing the stress level of the portion of layer of material.

U.S. Pat. No. 6,573,172: Methods for improving carrier mobility of PMOS and NMOS devices—Fabrication of semiconductor device by forming P-channel and N-channel metal oxide semiconductor transistors in wafer, forming tensile film on P-channel transistor and forming compressive film on N-channel transistor—Inventor: En, William George US20040075148A1: Semiconductor device—the transistors each comprise an insulated film wrapping a gate electrode and extending to a location adjacent to a source/drain area, and the insulated film is mainly composed of silicon nitride, and the thickness of the insulated film of the n-channel field effect transistor differs from the thickness of the insulated film of the p-channel field effect transistor. Inventor: Kumagai, Yukihiro; Tsuchiura, US20050093081A1: OXIDATION METHOD FOR ALTERING A FILM STRUCTURE AND CMOS TRANSISTOR STRUCTURE FORMED THEREWITH—Relaxing a tensile or compressive stress present in a film contacting a base layer by oxidizing the film to reduce a magnitude of the stress by supplying atomic oxygen to surface of the film—Inventor: Belyansky, Michael P.; Bethel, C T, US20050158937A1: METHOD AND STRUCTURE FOR CONTROLLING STRESS IN A TRANSISTOR CHANNEL—Manufacture of semiconductor device including n-type and p-type transistors comprises adjusting shallow trench isolation oxide corresponding to n-type and/or p-type devices and forming strain layer over semiconductor substrate.

Inventor: Yang, Haining S

SUMMARY OF THE INVENTION

The following presents a simplified summary in order to provide a basic understanding of some aspects of some of the example embodiments of the invention. This summary is not an extensive overview of the example embodiments. It is intended neither to identify key or critical elements of the example embodiments nor to delineate the scope of the invention.

Some of the example embodiments of the invention provide a method to improve the performance of MOS devices by increasing the stress in the channel region. An example embodiment for a NMOS transistor is to form a tensile stress layer over the NMOS transistor. An ion implant is performed into the stress layer and then an anneal is performed. This increases the amount of stress from the stress layer that the gate retains/memorizes.

An example embodiment method of fabricating a semiconductor device comprises the steps of:

providing a MOS transistor over substrate;

the MOS transistor comprised of a gate dielectric, a gate electrode, and source and drain regions in the substrate adjacent to the gate electrode;

forming a stress layer over the MOS transistor; the stress layer containing tensile stress;

implanting ions into the stress layer;

performing an anneal of the substrate and stress layer whereby the implant and anneal increase the stress on the channel region of the MOS transistor.

Another example embodiment is method of fabricating a semiconductor device comprises the steps of:

providing a NMOS transistor and a PMOS transistor over substrate;

the NMOS transistor comprised of a gate dielectric, a gate electrode, and source and drain regions in the substrate adjacent to the gate electrode;

forming an dielectric layer over the NMOS transistor and the substrate surface;

forming a stress layer over the MOS transistor; the stress layer containing tensile stress;

removing the dielectric layer and stress layer from over the PMOS transistor;

implanting ions into the stress layer;

performing an anneal of the stress layer and the gate electrode.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 5A and 5B are cross sectional views for illustrating a method for manufacturing a semiconductor device according to an example embodiment of the present invention.

DETAILED DESCRIPTION OF THE EXAMPLE EMBODIMENTS

I. Introduction

Some example embodiments of the invention provide a method to improve the performance of MOS devices by increasing the stress in the channel region. An example embodiment for a NMOS Transistor is to form a tensile stress layer (e.g., SiN) over a NMOS transistor.

A gate dielectric layer and poly gate are formed.

An ion implant is performed to amorphorize the gate so that the gate is comprised of amorphous Si.

An important Ion implantation (I/I) is performed on the (SiN) stress layer that will initially relax the stress film but when combined with a subsequent anneal, will increase the tensile stress in the stress film higher than the initial starting stress.

Then an anneal is performed that can serve two purposes: (i) increasing the tensile stress of the implanted stress film, (ii) crystallizes the silicon containing gate thus increasing the amount of stress from the stress layer that the gate retains/memorizes.

The Si containing gate retains/memorizes a higher tensile stress from the SiN layer and the gate transfers this stress to the NMOS Tx channel. The Si in NMOS channel is under increased tensile stress that increases the electron mobility that increases device performance.

Examples of two key steps in the modulation of the stress of the stress (e.g., nitride) film are as follows.

First, a high dose (0.5~5E15) and lower energy (15 keV) heavy ion is implanted into the stress film.

Second, a high temperature anneal (for example using the typical SD anneal) (e.g, between 850 and 1300 C) is needed to enhance/modulate the stress in the stress layer which can then be transferred to the gate.

An example of this heavy ion implantation to enhance the nitride stress film stress can be used in the modified SMT flow as shown below.

The example embodiments of the present invention will be described in detail with reference to the accompanying drawings. The example embodiments provide a method of forming a FET using a stress layer and a heavy ion implant that increases stress layer stress.

A. Provide NMOS Tx and PMOS Tx

Figure 1:
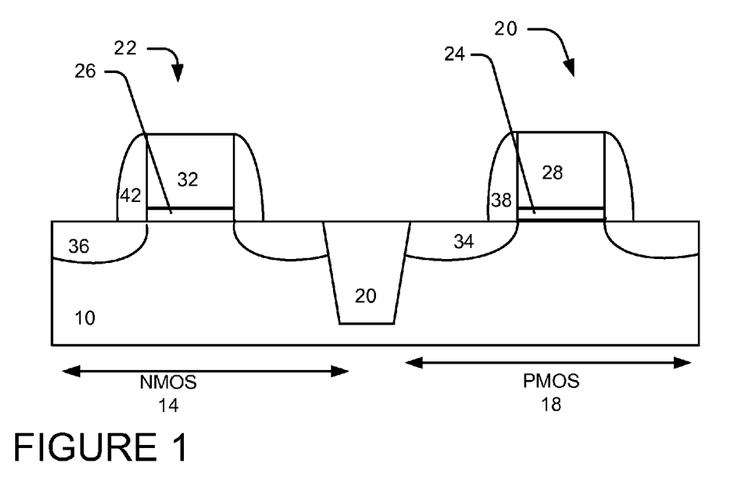

As shown in FIG. 1, we provide a NMOS transistor 22 in a NMOS region 14 and a PMOS transistor 20 in a PMOS region 18 over substrate 10.

The NMOS transistor 22 can be comprised of a gate dielectric 26, a gate electrode 32, and LDD (lightly doped source/drain or SDE) regions (not shown); source and drain region 36 in the substrate adjacent to the gate electrode; and sidewall spacers 42.

The NMOS gate electrode 32 can be comprised of silicon, polysilicon or polySiGe or Ge; and is preferably comprised of polysilicon.

The PMOS transistor 20 can be comprised of a gate dielectric 24, a gate electrode 28, and LDD (lightly doped source/drain or SDE) regions (not shown; source and drain regions 34 in the substrate adjacent to the gate electrode 28 and sidewall spacers 38. The PMOS gate electrode 32 can be comprised of silicon, polysilicon or polySiGe or Ge.

B. Amorphous Gate

At least portions of the gate that will have the stress film and anneal process should be comprised of amorphous silicon prior to the formation of the stress film. This can be accomplished by an ion implant into the gate. For example, a separate gate amorphorizing implant can be performed to implant ions into the gate. Likewise, if a Source/Drain pre amorphization implant (PAI) is performed, C. Form Dielectric Layer Next referring to FIG. 2, we form an optional dielectric layer 44 over the MOS transistor and the substrate surface.

Figure 2:
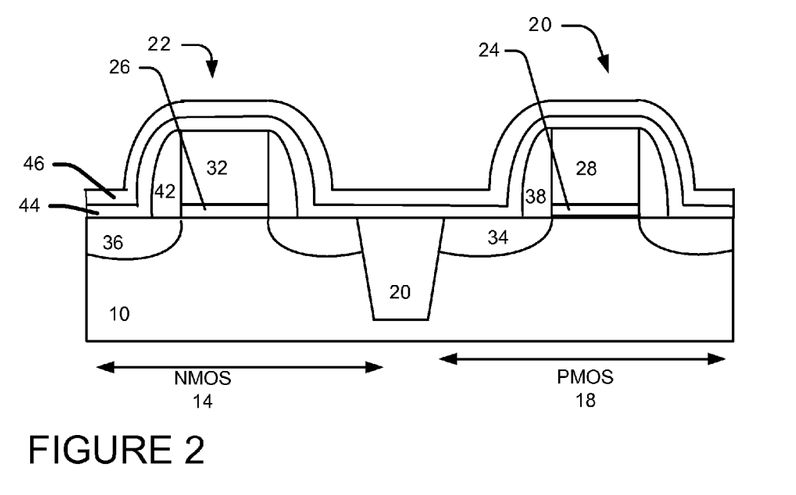

The dielectric layer can be comprised of oxide layer 44 and is preferably comprised of oxide. The dielectric layer can have a thickness between 30 and 200 angstroms (tgt=100 angstroms). The dielectric layer can be comprised of a low temperature oxide layer (LTO).

The dielectric layer serves as reducing the defects when nitride layer is deposited on Si surface. It also serves as etch stop for nitride removal. It can be an optional layer if etch process is well tuned.

D. Form Stress Layer

Next, we form a (first) stress layer 46 over the dielectric layer 44.

In this example, the stress layer has tensile stress. The tensile stress layer 44 puts a tensile stress on the underlying channel of the MOS Tx.

The stress layer 46 can be comprised of silicon oxy-nitride (SiON) or silicon nitride and can have a thickness between 300 and 1000 angstroms (tgt=400 angstroms).

At this time in the process, the stress layer 46 can have a tensile stress of between 0.3 GPa and 1.2 GPa.

E. Ion Implant Ions into the Stress Layer

Figure 3:
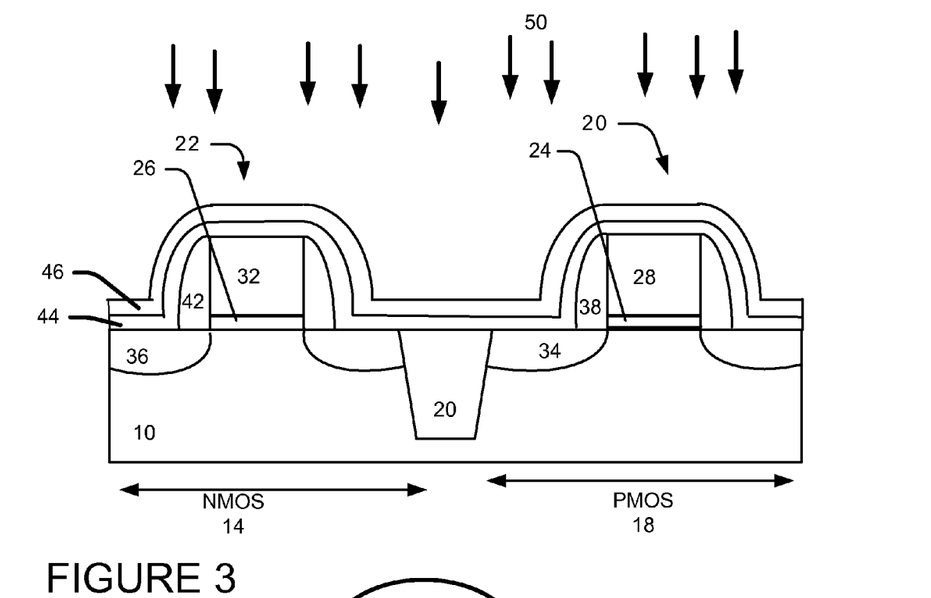

As shown in FIG. 3, in a key step, we implant ions using a high dose/low energy implant process into the stress film. The heavy ion (or large ions) ions 50 are implanted into the stress layer 46 and preferably not below the stress layer. Preferably the majority of ions stop in the stress layer 46 and more preferably substantially all the ions preferably stop in the stress layer.

The stress layer implant can use Ge or Xe ions or other large ions that have a molecular weight greater than or equal to 28 (e.g., Si and above Si in periodic table). For example, the ions can be comprised of: Ge, Ar, Xenon, indium, antimony, Si, N, O or C.

The (e.g., Ge or Xe) ions can be implanted at a dose between 0.5E15 and 5E15 atoms/cc and preferably between 1E15 and 2 E15 atoms/cc; and at an energy between 5 and 50 KeV and preferably about 15 KeV. For example, the implant energy depends on nitride stress layer thickness, i.e., for a stress layer with a 300 Angstrom thickness, the ion implant energy will be about 15 keV.

Preferably, the stress film (e.g., SiN) can have an ion (e.g., Ge or Xe) concentration in the range from 1E20 to 1E22 atom/cm$^{-3}$.

This ion implant (Ge I/I) parameters are targeted so the ions are substantially contained within the SIN stress layer.

F. Remove the Stress Layer from the PMOS Region

Figure 4:
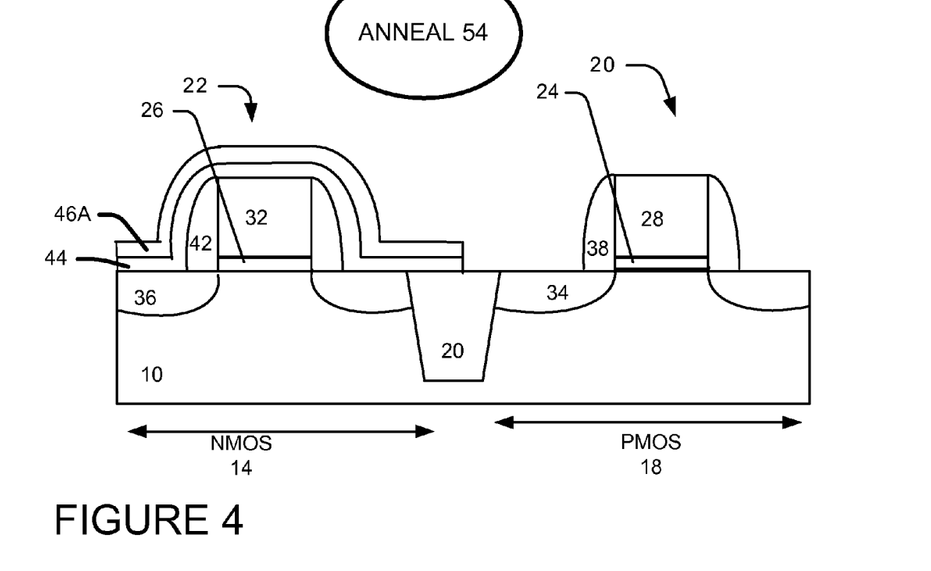

Referring to FIG. 4, we remove the stress layer 46 and dielectric layer 44 from the PMOS region 18. The stress layer can be removed using a mask and pattern process. The stress layer 46A remains over the NMOS Tx 22.

G. Perform an Anneal of the Substrate

Referring to FIG. 4, we perform an anneal 54 of the substrate.

The anneal can be performed at a temperature between 850 and 1300 C; for a time between 0.001 and 20 seconds. A typical anneal is performed at 950 degrees C. for about 5 seconds.

The purpose of the anneal is to "increase" the tensile stress of the stress layer as well as re-crystallize the poly or amorphous silicon gate.

The anneal can increase the tensile stress in the stress layer 46A by between about 10 and 60%.

After the anneal, the SIN stress layer 46A has a tensile stress between 1.4 and 2.0 GPa. This tensile is between about a 10 and 60% increase compared to the tensile (e.g., SiN) layer before the ion implant and anneal.

The anneal can be part of a S/D anneal. Also a special separate higher temperature and short duration anneal can also be inserted. For example a laser anneal can be performed.

An example of a S/D anneal that will adequately anneal the invention's ion implanted stress layer 46A. The S/D anneal can be performed at a temperature between 600 and 1300 C and preferably between 850 and 1300 C and more preferably between 925 and 1300 C for a time between close to zero (spike or laser anneal) 0.1 seconds and 5 minutes. For example, a typical S/D anneal is at 950 C for 5 sec. A lower temperature than 950 C may cause large amount of transient enhance diffusion which is bad for current technologies.

In an other example, the anneal can be performed at a temperature between 850 and 1300 C; for a time between 0.01 seconds and 5 minutes.

The embodiment's steps of: (1) I/I into the SiN stress layer, and (2) anneal increases the tensile stress in the NMOS channel thereby improving NMOS performance.

The ion implant coupled with anneal increases the initial stress film stress. As a result the "memorized" stress transferred to the gate is more significant as compared to plainly using an initial tensile (e.g. SiN) stress film which has tensile stress to date that saturates at about 1.2 GPa.

There are two theories of how the embodiment's ion implant and anneal increase the stress on the channel region. First the ions break the Si—N—H bonds in the stress layer and during the annealing process more H escape causing the stress film to be more tensile. Second, the possibility of forming Ge—N bonds in the SiGe N system can increase the stress. (more generally X—N bonds where the implanted ion is X). For example, the Ge concentration can range from 1E20 to 1E22 cm$^{-3}$ in a stress layer to increase the tensile stress.

H. Remove the Stress Layer

Figure 5A:
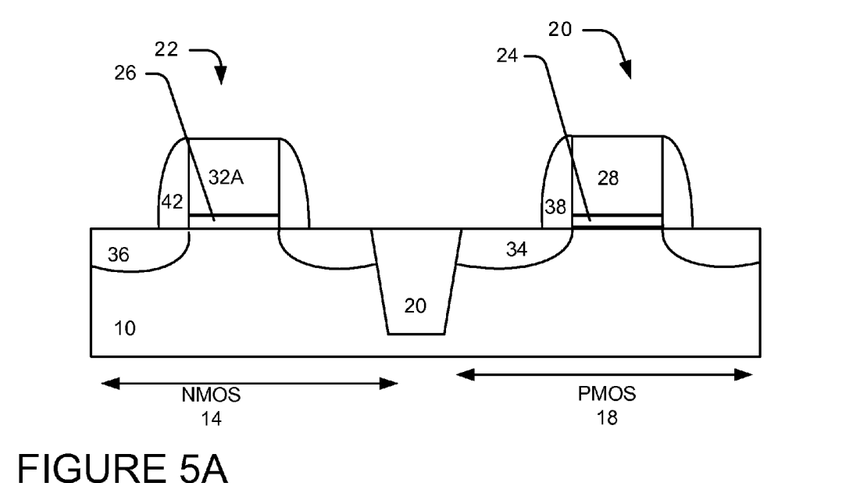

Referring to FIG. 5A, we preferably remove the dielectric layer 44 and the stress layer 46.

I. Subsequent Process Steps

Figure 5B:
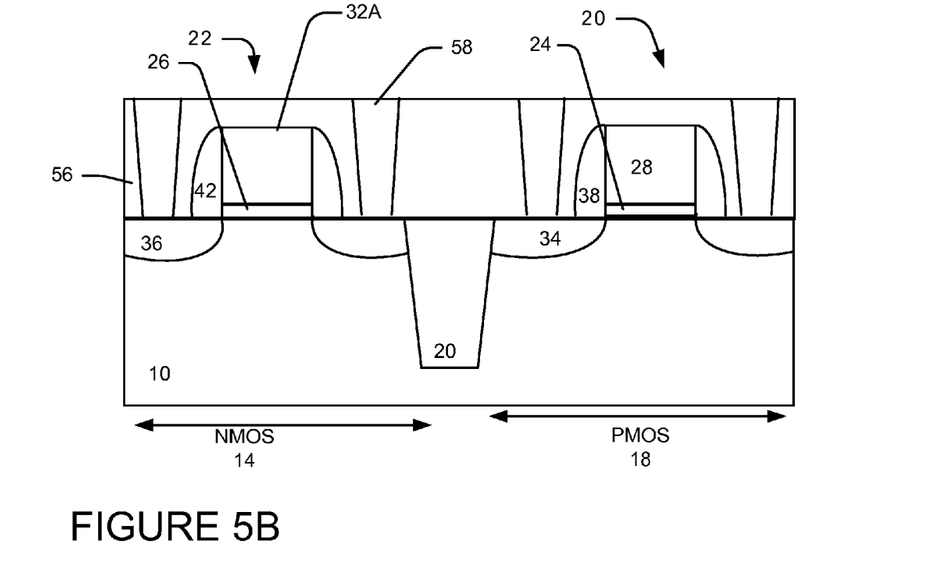

Conventional processing is performed to complete the devices. An example sequence is salicide, ESL (any combination of tensile and compressive), IDL Deposition, contact etch, etc ... (i.e. standard process flow after S/D anneal). For example, FIG. 5B shows an overlying dielectric layer 56 and contacts 58.

It may be possible to form a tensile or compressive etch stop layer over the gate structures to further improve the channel stress.

For example, we could form a tensile CESL (contact etch stop layer) SiN over the NMOS transistor, then form ILD layer, and then form contact holes. The tensile ESL over the NMOS transistor might increase the tensile strain on the NMOS channel.

J. Review

The example embodiment aims to provide an approach to increase the overall stress of the stress film 46 and hence increasing the stress level that can be induced in the Si channel. In this example, the I/I 50 into the stress layer 46 and the subsequent anneal 54 increases the stress on the poly gate 32A. After the stress layer 46 is removed, the poly gate 32A retains ("Memorization") the stress from the stress layer 46 and puts a tensile stress on the channel region in the substrate.

A tensile stress layer is preferably deposited after S/D implantation. The gate and S/D regions are amorphorized either by the initial S/D implant or by additional Ge I/I during the S/D step. As such, after an annealing step, the gate and S/D region re-crystallized and memorized the stress by the tensile stress layer. The actual stress transfer mechanism is not well understood yet (i.e. it can either be from the gate or the S/D regions).

K. Examples

The following non-limiting examples represent preferred forms and best modes contemplated by the inventor for practice of his invention, as well as illustrating the results obtained through its use.

Figure 6:
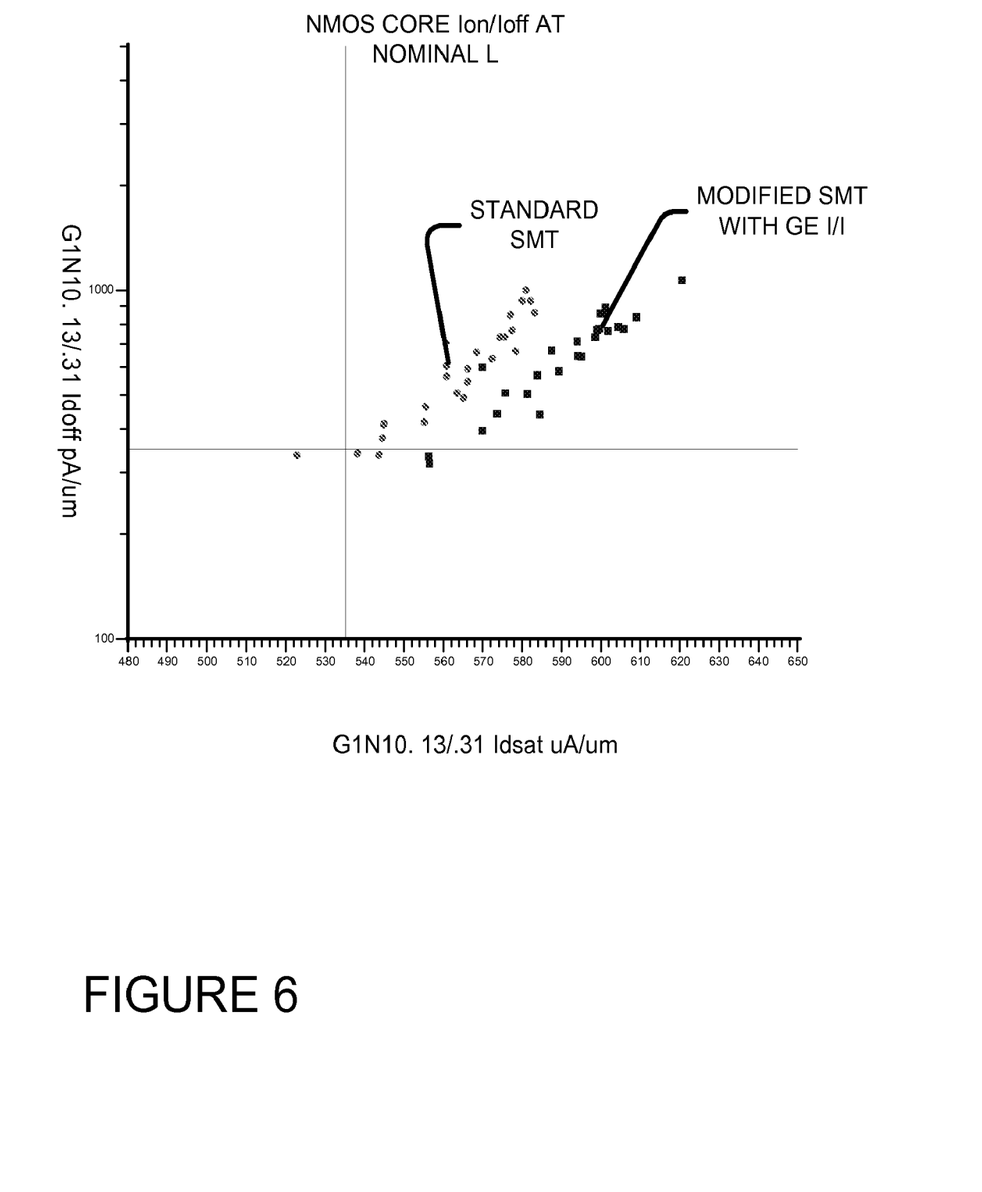
FIGS. 6 and 7 shows Si Data for the example embodiment vs a method using only steps of: SiN stress layer and anneal (no Ge I/I).
Figure 7:
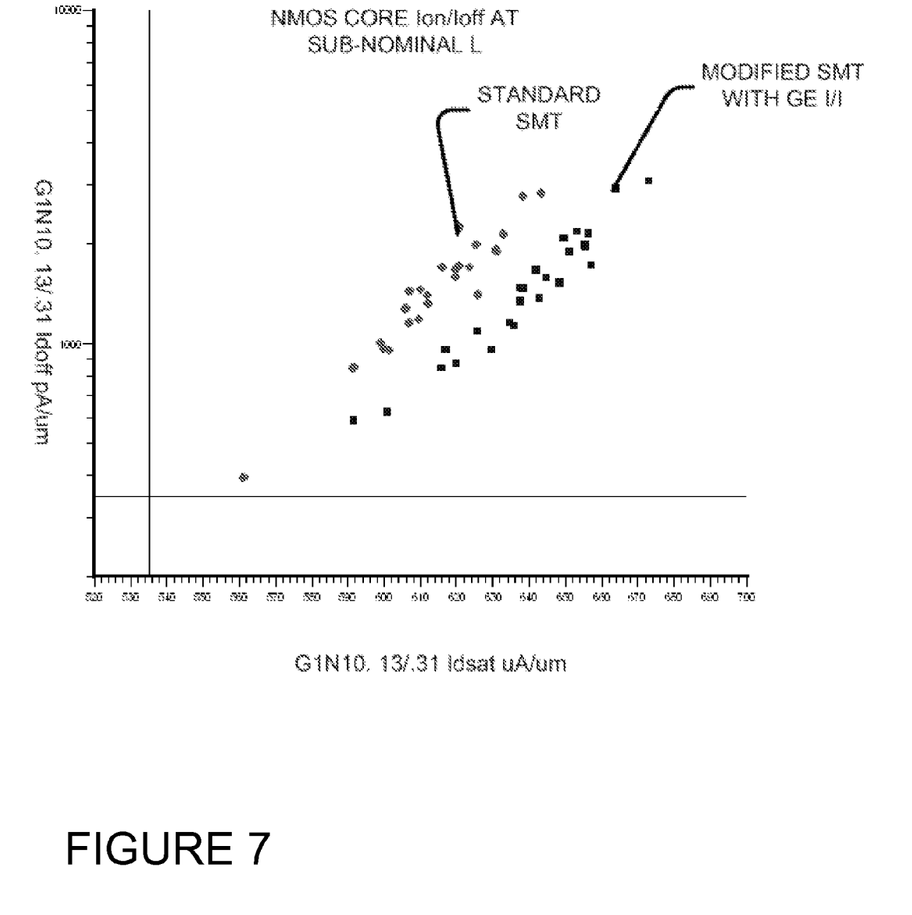

FIGS. 6 and 7 show Si Data for the example embodiment vs a method using only steps of: SiN stress layer and anneal (no Ge I/I).

FIG. 6 shows nMOS Core Ion/Ioff at nominal L. FIG. 6: Gate length: 110 nm, SiN stress layer thickness: 300 A, dielectric (oxide) thickness 100 A. The S/D anneal was for 5 s at about 950 C.

FIG. 7 shows nMOS Ion/Ioff at sub-nominal L, FIG. 7: Gate length: 100 nm, SiN thickness: 300 A, oxide thickness 100 A; g1n110 13/1. For FIG. 7, the S/D anneal was for 5 s at about 950 C.

The embodiment of the invention achieved Ion/Ioff enhancement for nFET of ~4% and 5% is achieved for a gate length of 110 nm and 100 nm respectively. Since stress memorization technique (SMT) process is expected to have larger impact of smaller dimension devices, this makes the current technique more ideal for more advance technology nodes.

L. Non-Limiting Example Embodiments

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a semiconductor device comprising:
   Providing a substrate prepared with a transistor of a first transistor type, the transistor having a gate with a gate electrode;
   forming a stress layer of a first stress type over the transistor, the stress layer having a first stress value, the first stress type improves carrier mobility of the first transistor type;
   implanting ions into the stress layer, wherein implanting ions relaxes stress in the stress layer, resulting in a second stress value which is less than the first stress value;
   annealing the substrate, to increase stress in the stress layer to result in a third stress value of the first stress type, which is greater than the second stress value, wherein annealing crystallizes the gate electrode and imparts the increased stress of the stress layer to the gate electrode; and
   removing the stress layer after annealing.

2. The method of claim 1 wherein the third stress value of the first type is greater than the first stress value of the first stress type.

3. The method of claim 2 wherein the gate electrode comprises an amorphous silicon gate electrode which is crystallized by a high temperature anneal at about 600-1300° C.

4. The method of claim 1 wherein the gate electrode comprises an amorphous gate electrode which is crystallized by a high temperature anneal at about 600-1300° C.

5. The method of claim 1 wherein the transistor comprises an amorphous silicon gate electrode which is crystallized by the anneal.

6. The method of claim 1 wherein the stress layer comprises a tensile stress and the transistor comprises a n-type transistor.

7. The method of claim 6 wherein implanting comprises implanting ions with a molecular weight greater than or equal to 28.

8. The method of claim 6 wherein implanting comprises implanting ions comprising Ge, Zr, Xe, In, Sb, Si, N, O, C or a combination thereof.

9. The method of claim 6 wherein the stress layer comprises silicon nitride, silicon oxide or oxynitride.

10. The method of claim 1 wherein implanting comprises implanting ions with a molecular weight greater than or equal to 28.

11. The method of claim 1 wherein the stress layer comprises silicon nitride, silicon oxide or oxynitride.

12. A method of fabricating a device comprising:
    providing a substrate prepared with a feature;
    forming a stress layer over the feature, the stress layer having a first stress type with a first stress value, wherein the first stress type is desired over the feature;
    implanting ions into the stress layer to relax the stress in the stress layer, the relaxed stress layer having a second stress value which is less than the first stress value;
    annealing the substrate, to increase stress in the relaxed stress layer to result in a third stress value of the first stress type, wherein the anneal imparts the increased stress of the stress layer to the feature, wherein the feature induces stress on a region of the substrate beneath the feature; and
    removing the stress layer after annealing.

13. The method of claim 12 wherein the third stress value of the first stress type is greater than the first stress value of the first stress type.

14. The method of claim 12 wherein annealing comprises a high temperature annealing at about 600-1300° C.

15. The method of claim 12 wherein the feature comprises an amorphous material and annealing crystallizes the amorphous material.

16. The method of claim 12 wherein implanting comprises implanting ions comprising Ge, Zr, Xe, In, Sb, Si, N, O, C or a combination thereof.

17. The method of claim 12 wherein the feature comprises a gate of a transistor, the gate includes a gate electrode.

18. The method of claim 17 wherein the third stress level of the first stress type is greater than the first stress level of the first stress type.

19. The method of claim 18 wherein the stress layer comprises silicon nitride, silicon oxide or oxynitride.

20. The method of claim 18 wherein the stress layer comprises a tensile stress layer and the transistor comprises a n-type transistor.

21. The method of claim 17 comprises removing the stress layer after annealing, wherein the anneal imparts the increased stress of the stress layer to the gate electrode, the gate electrode induces stress on a channel region of the transistor to improve performance of the transistor.

22. The method of claim 17 wherein annealing comprises a high temperature annealing at about 600-1300° C.

23. The method of claim 17 wherein the gate electrode comprises an amorphous gate electrode and annealing crystallizes the amorphous gate electrode.

24. The method of claim 17 wherein implanting comprises implanting ions comprising Ge, Zr, Xe, In, Sb, Si, N, O, C or a combination thereof.

25. A method of forming an integrated circuit comprising:
providing a substrate prepared with a first transistor with a gate having a gate electrode, the first transistor comprises a first carrier type;
forming a stress layer over the substrate, wherein the stress layer covers the first transistor, the stress layer comprises a first stress type with a first stress value;
implanting ions into the stress layer which is exposed to relax the stress layer to produce a relaxed stress layer with a second stress value;
annealing the substrate with a high temperature anneal, wherein the anneal increases stress in the relaxed stress layer to a third stress value which is greater than the second stress value; and
removing the stress layer from the transistor, wherein the high temperature anneal imparts the increased stress of the stress layer to the gate electrode.

26. The method of claim 25 wherein a first NMOS transistor is provided in a NMOS region and a second PMOS transistor is provided in a PMOS region.

27. The method of claim 25 wherein the stress layer comprises a tensile stress with a stress value between 0.3 GPa and 1.2 GPa.

28. The method of claim 25 wherein the implanted ions is comprised of Ge, Ar, Xenon, indium, antimony, Si, N, O or C.

29. The method of claim 25 wherein the ions is implanted at a dose between 0.5E15 and 5E15 atom/cc; and at an energy between 5 and 50 KeV.

30. The method of claim 25 wherein the anneal is performed at a temperature between 850 and 1300 C; for a time between 0.001 and 20 seconds.

31. The method of claim 25 wherein the performance of an anneal increases the tensile stress, with the second stress value, of the implanted stress film; and crystallizes the silicon containing gate thus increasing the amount of stress from the stress layer that the gate retains/memorizes, resulting in the third stress value.

32. A method of forming an integrated circuit comprising:
providing a substrate prepared with first and second active regions with first and second transistors of first and second carrier types, the first transistor having a first gate electrode and the second transistor having a second gate electrode;
forming a stress layer over the substrate in first and second active regions covering the first and second transistors, the stress layer having a first stress type, which improves carrier mobility of the first transistor;
implanting ions into the stress layer in the first active region to relax the first stress in the stress layer in the first active region to produce a second stress which is less than the first stress;
removing a portion of the stress layer in the second active region, leaving the relaxed stress layer over the first active region;
annealing the substrate with a high temperature anneal, wherein the anneal increases the second stress in the relaxed stress layer; and
removing the stress layer from the transistor, wherein the high temperature anneal crystallizes the first electrode to impart the increased stress of the stress layer to the gate electrode.

* * * * *